(12) United States Patent
Parsche et al.

(10) Patent No.: US 7,889,026 B2
(45) Date of Patent: Feb. 15, 2011

(54) ELECTRONICALLY VARIABLE INDUCTOR, ASSOCIATED TUNABLE FILTER AND METHODS

(75) Inventors: Francis Eugene Parsche, Palm Bay, FL (US); John S. Seybold, Malabar, FL (US)

(73) Assignee: Harris Corporation, Melbourne, FL (US)

(*) Notice: Subject to any disclaimer, the term of this patent is extended or adjusted under 35 U.S.C. 154(b) by 36 days.

(21) Appl. No.: 11/971,016

(22) Filed: Jan. 8, 2008

(65) Prior Publication Data

US 2009/0174501 A1 Jul. 9, 2009

(51) Int. Cl.
*H03H 7/00* (2006.01)

(52) U.S. Cl. .................... 333/174; 333/17.1

(58) Field of Classification Search .......... 333/17.1, 333/174; 336/229, 180–184
See application file for complete search history.

(56) References Cited

U.S. PATENT DOCUMENTS

| 2,996,695 | A | | 8/1961 | Dickinson ............ 336/115 |
| 3,609,083 | A | * | 9/1971 | Slick .................. 252/62.62 |
| 3,629,741 | A | | 12/1971 | Brune .................... 333/78 |
| 3,668,589 | A | * | 6/1972 | Wilkinson ............ 336/212 |
| 3,735,305 | A | * | 5/1973 | Sinnott et al. ......... 336/110 |
| 4,075,551 | A | * | 2/1978 | Zabler ................ 324/207.16 |
| 4,682,126 | A | * | 7/1987 | Milberger et al. ..... 333/81 B |
| 4,728,918 | A | | 3/1988 | Neusser et al. ......... 336/83 |
| 4,943,793 | A | * | 7/1990 | Ngo et al. .............. 336/83 |
| 5,072,200 | A | * | 12/1991 | Ranky ................. 333/167 |
| 5,450,052 | A | | 9/1995 | Goldberg et al. ......... 336/83 |
| 6,005,467 | A | | 12/1999 | Abramov ............. 336/200 |

FOREIGN PATENT DOCUMENTS

| DE | 438735 C | | 12/1926 |
| DE | 922420 C | | 1/1955 |
| DE | 1074678 B | | 2/1960 |
| DE | 1076818 B | | 3/1960 |
| JP | 63086406 A | * | 4/1988 |

* cited by examiner

*Primary Examiner*—Robert Pascal
*Assistant Examiner*—Kimberly E Glenn
(74) *Attorney, Agent, or Firm*—Allen, Dyer, Doppelt, Milbrath & Gilchrist, P.A.

(57) ABSTRACT

The electrically tunable inductive device includes an electromagnet including an electromagnet core and a bias or tuning coil cooperating therewith to define opposing magnetic poles for generating a quiescent magnetic field that may be varied. An inductor is tunable based upon the variable magnetic field and includes an inductor core having a toroidal shape and fixed at a position adjacent the opposing magnetic poles of the electromagnet, and an inductor or signal coil is around at least a portion of the inductor core. The electromagnet core may include a pair of opposing legs and a bight portion therebetween defining a horseshoe shape. The inductor core may be positioned between ends of the opposing legs of the electromagnet core, and the tuning coil may surround the bight portion of the electromagnet core. The electrically tunable inductive device may have the combination of fine precision, high speed and high power handling, useful for tunable RF filters.

21 Claims, 3 Drawing Sheets

ELECTRONICALLY VARIABLE INDUCTOR, ASSOCIATED TUNABLE FILTER AND METHODS

FIELD OF THE INVENTION

The present invention relates to the field of wireless communications, and, more particularly, to inductors and variable inductors, tuning and tunable RF filters and related methods.

BACKGROUND OF THE INVENTION

Variable reactors or electronic components of variable reactance, such as variable inductors or variable capacitors are important for tuning purposes (changing frequency) in radio electronics. They may be mechanically or electronically varied, and called upon to handle a variety of power levels from small signals to large signal and power control applications. They may be applied at any frequency where components are available, from audio to the extreme high end of the radio frequency (RF) spectrum.

Inductors are a fundamental electromagnetic component used for a wide variety of purposes in RF circuits. Inductors having large inductances typically include wires wrapped around a bulk dielectric or ferrimagnetic core, and are used in resonant circuits, filters, transformers and other devices. Radio frequency inductors are typically helical coils having an air or ferrite core. Ferrimagnetic core materials are substantially nonconductive and suitable for use at RF and microwave frequencies, while ferromagnetic core materials are generally conductive metallic materials and used at low frequencies.

A variable reactor may involve a biasable media, which may be conductive, dielectric, or magnetic. An example of this is the separation of charge in a semiconductor media, as is accomplished in varicap or varactor diodes. In this device, the media is semiconductor and the bias a DC potential applied thereupon. Varactor diodes are a widespread and inexpensive method for electronic tuning in RF circuits. Yet, their utility may be limited for some tuning requirements, as for instance they may not be suited for high RF power levels due to voltage limitations, and in some instances a variable inductor is needed.

For example, U.S. Pat. No. 6,005,467 to Abramov is directed to a trimmable inductor including a supporting substrate having spaced apart lead terminals, a coil defined by an electrically conductive member mounted on the substrate in a continuous path of multiple turns forming a winding about an axis extending between the lead terminals, and an electric conductive shorting member extending and electrically connected between at least two adjacent windings of the coil to enable selective inclusion and elimination of one of the windings. Cuts are made in the conductors or shorting member to trim the inductor.

Also, U.S. Pat. No. 5,450,052 to Goldberg, et al. is entitled ""Magnetically variable inductor for high power audio and radio frequency applications"". The patent discloses a magnetically variable inductor for high power, high frequency applications which includes a solenoid with a magnetic core therein, disposed coaxially around a conductor for carrying the high power, high frequency signal, and a variable current source coupled with the solenoid so that a manipulation of the current through the solenoid results in a variable inductance for the conductor.

Mechanical inductors may include variometers, coils with moveable ferrite slugs, or roller types where a helix is rotated with respect to a ""roller"" tap. Choices for nonmechanical electrically variable inductors may be more limited. The current state of the art for tunable inductors generally includes, for example: varactor-fixed inductor combinations which may have fine precision, fast speed and are low power handling; relays which are bulky, may have crude precision, medium speed and can offer high power handling; and motor driven types which are bulky, may have fine precision, slow speed and high power handling. However, the combination of fine precision, high speed and high power handling is not available.

There exists a need for an electrically variable, adjustable or tunable inductor of practical size and construction, with high Q/efficiency and having fine precision, high speed and high power handling features. Such a tunable inductor may be used as an antenna pre-selector and/or post-selector filter and is particularly attractive in applications requiring rapid retuning. Yet another need would be for antenna loading, as for tuning a small dipole or whip.

SUMMARY OF THE INVENTION

In view of the foregoing background, it is therefore an object of the present invention to provide an electrically tunable inductive device having the combination of fine precision, high speed and high power handling.

This and other objects, features, and advantages in accordance with the present invention are provided by an electrically tunable inductive device including an electromagnet comprising an electromagnet core and a bias or tuning coil cooperating therewith to define opposing magnetic poles for generating a variable magnetic field. An inductor is tunable based upon the variable magnetic field and includes an inductor core having a toroidal shape and fixed at a position adjacent the opposing magnetic poles of the electromagnet, and an inductor or signal coil around at least a portion of the inductor core.

The electromagnet core may comprise a pair of opposing legs and a bight portion therebetween defining a horseshoe shape. The inductor core may be positioned between ends of the opposing legs of the electromagnet core, and the tuning coil may surrounds the bight portion of the electromagnet core.

The electromagnet core may comprise a silicon-steel core, and the inductor core may comprise a ferrite core or a nickel zinc ferrite core. A radio frequency (RF) feed may be connected to the signal coil and a capacitor connected therebetween.

Another aspect is directed to a band-stop tunable filter comprising an electrically tunable inductive device including an electromagnet comprising an electromagnet core and a tuning coil cooperating therewith to define opposing magnetic poles. A tunable inductor includes an inductor core having a toroidal shape and is fixed at a position adjacent the opposing magnetic poles of the electromagnet, and a signal coil around at least a portion of the inductor core. A radio frequency (RF) feed is connected to the signal coil, and a control signal feed is connected to the tuning coil.

A method aspect is directed to making an electrically tunable inductive device comprising providing an electromagnet including an electromagnet core and a tuning coil cooperating therewith to define opposing magnetic poles for generating a variable magnetic field. The method includes providing an inductor being tunable based upon the variable magnetic field and comprising an inductor core having a toroidal shape and fixed at a position adjacent the opposing magnetic poles of the electromagnet, and a signal coil around at least a portion of the inductor core.
"

Applying a DC magnetic field to an inductor core alters the permeability of the core, and thereby the inductance and the DC control response may be linear for small movements. The conductive electromagnet material isolates the RF circuit from the DC control circuitry and vice versa, and sufficient inductance variation is obtained in the inductor core before the electromagnet core saturates. Such a tunable inductor or filter may be used, for example, in frequency hopping systems. Such an electrically tunable inductor may be a component for a variety of applications including: tunable pre/post selector filters; dynamic antenna matching with signal modulation; adaptive interference mitigation filters; and may be an ideal component for use in a software defined radio (SDR).

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
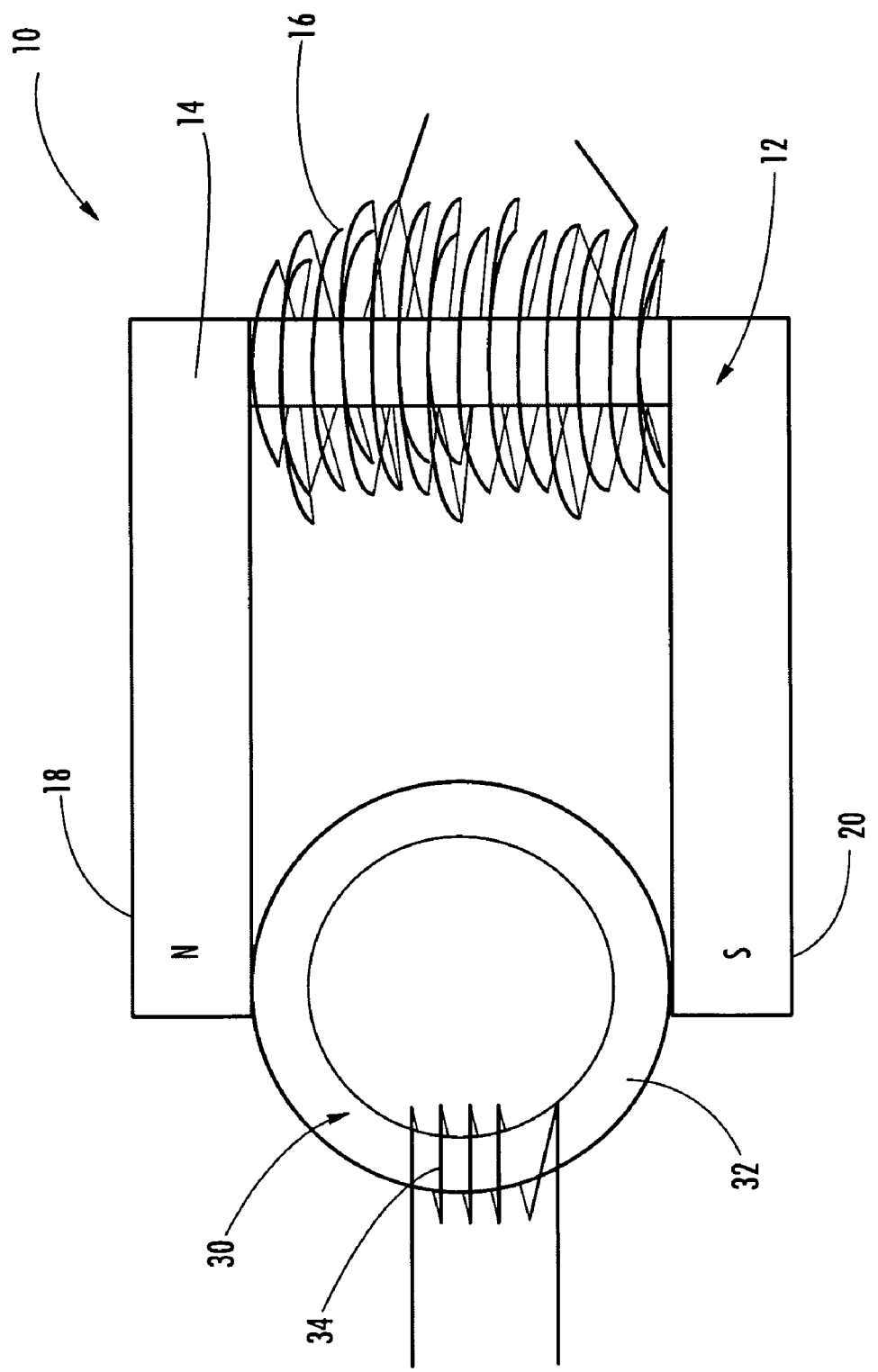
FIG. 1 is a schematic diagram illustrating an electrically tunable inductive device in accordance with an embodiment of the present invention.

Referring initially to FIG. 1, an electrically tunable inductive device 10 will now be described. The electrically tunable inductive device 10 may have the combination of fine precision, high speed and high power handling. As illustrated, the electrically tunable inductive device 10 includes an electromagnet 12 which includes an electromagnet core 14 and a tuning coil 16 cooperating therewith to define opposing magnetic poles 18, 20 for generating a variable magnetic field.

An inductor 30 is tunable based upon the variable magnetic field and includes an inductor core 32, e.g. having a toroidal shape, and fixed at a position adjacent the opposing magnetic poles 18, 20 of the electromagnet core 14. As would be appreciated by those skilled in the art, the inductor core 32 may comprise a ferrite core or a nickel zinc ferrite core, for example. A signal coil 34 is wrapped around at least a portion of the inductor core 32.

The electromagnet core 14 may include a pair of opposing legs 40, 42 and a bight portion 44 therebetween defining a horseshoe shape. The inductor core 32 may be positioned between ends 18, 20 of the opposing legs 40, 42 of the electromagnet core 14, and the tuning coil 16 may surround the bight portion 44 of the electromagnet core, to form a magnetic circuit as is common. The electromagnet core may comprise a conductive silicon-steel core and include laminations to enhance control speed, although the invention is not so limited as to require lamination.

Important physical properties of the electromagnet core 14 include high permeability and conductivity, which silicon-steels provide. In the present invention the high permeability provides for an intense DC magnetic control field for small DC tuning bias currents. Additionally, the high permeability of electromagnetic core 14 ($\mu_{electromagnet\ core} \gg \mu_{inductor\ core}$) ensures that inductor core 32 magnetically saturates before electromagnet core 14. This helps to ensure the maximum inductance variation, (i.e. tuning range), is accomplished from the present invention. In a prototype, full inductance variation was easily obtained in the inductor core 32 before the electromagnet core 14 saturated. That is, the inductor core 32 saturated before electromagnet core 14 saturated and the permeability of silicon steel may be 10,000 while the permeability of RF ferrites is often much less, perhaps 10 to 1000.

High conductivity in the electromagnetic core 14 prevents RF magnetic fields from inductor core 32 penetrating electromagnetic core 14, thereby isolating the RF and DC windings from each other except for the desired control function. The present invention has provided an inductance variation of 7 to 1 in some prototypes, for a tuning range of 2.6 to 1. In general, the RF circuit tuning range of the present invention is square root of the inductance variation, according to the parallel resonance formula:

$$f = 1/2\pi\sqrt{LC}$$

so that $$(\Delta f) = \sqrt{(\Delta L)}$$

Figure 2:
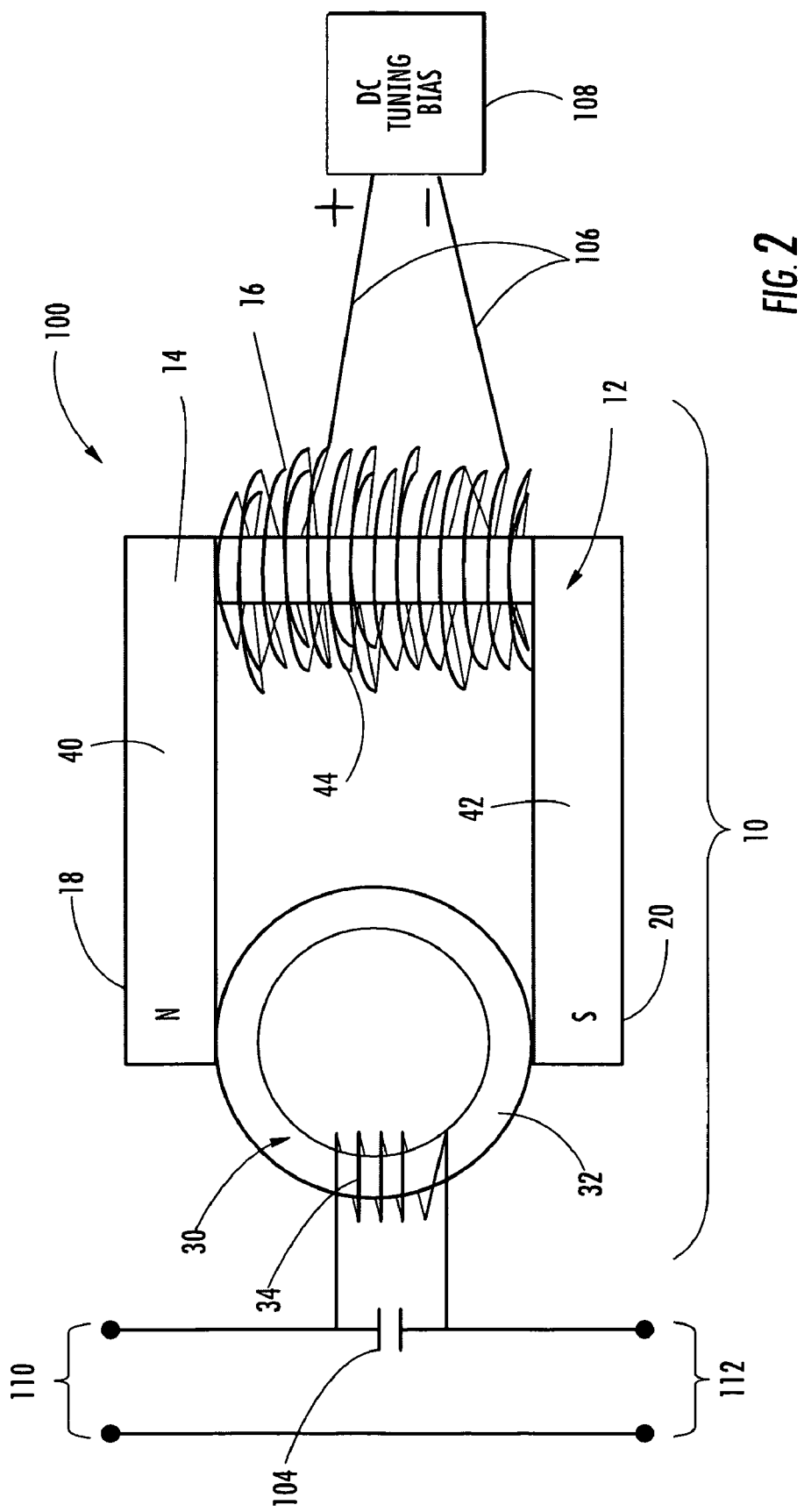
FIG. 2 is a schematic diagram illustrating a tunable filter including the electrically tunable inductive device of FIG. 1.

Another aspect of the invention is directed to a band-stop tunable filter 100 which will be described with reference to FIG. 2. The band stop filter 100 includes an electrically tunable inductive device 10, as described with reference to FIG. 1. Referring now to FIG. 2, a fixed capacitor 14 is connected across the terminals of signal coil 34, and radio frequency (RF) ports 110 and 112 are connected to the parallel combination of signal coil 34 and capacitor 104 therebetween, and a control signal feed 106 is connected to the tuning coil, A DC control signal or "tuning bias" current is provided by a DC tuning Bias block 108 for the purpose of tuning the filter 100.

The present invention is not of course so limited as to tuning band stop filters, and all types of filters may be realized and tuned as will be appreciated by those skilled in the art. The present invention electrically variable inductor is a general purpose variable reactance device.

In signal processing, a band-stop filter or band-rejection filter is a filter that passes most frequencies unaltered, but attenuates those in a specific range to very low levels. It is the opposite of a band-pass filter. A notch filter is a band-stop filter with a narrow stopband (high Q factor).

Figure 3:
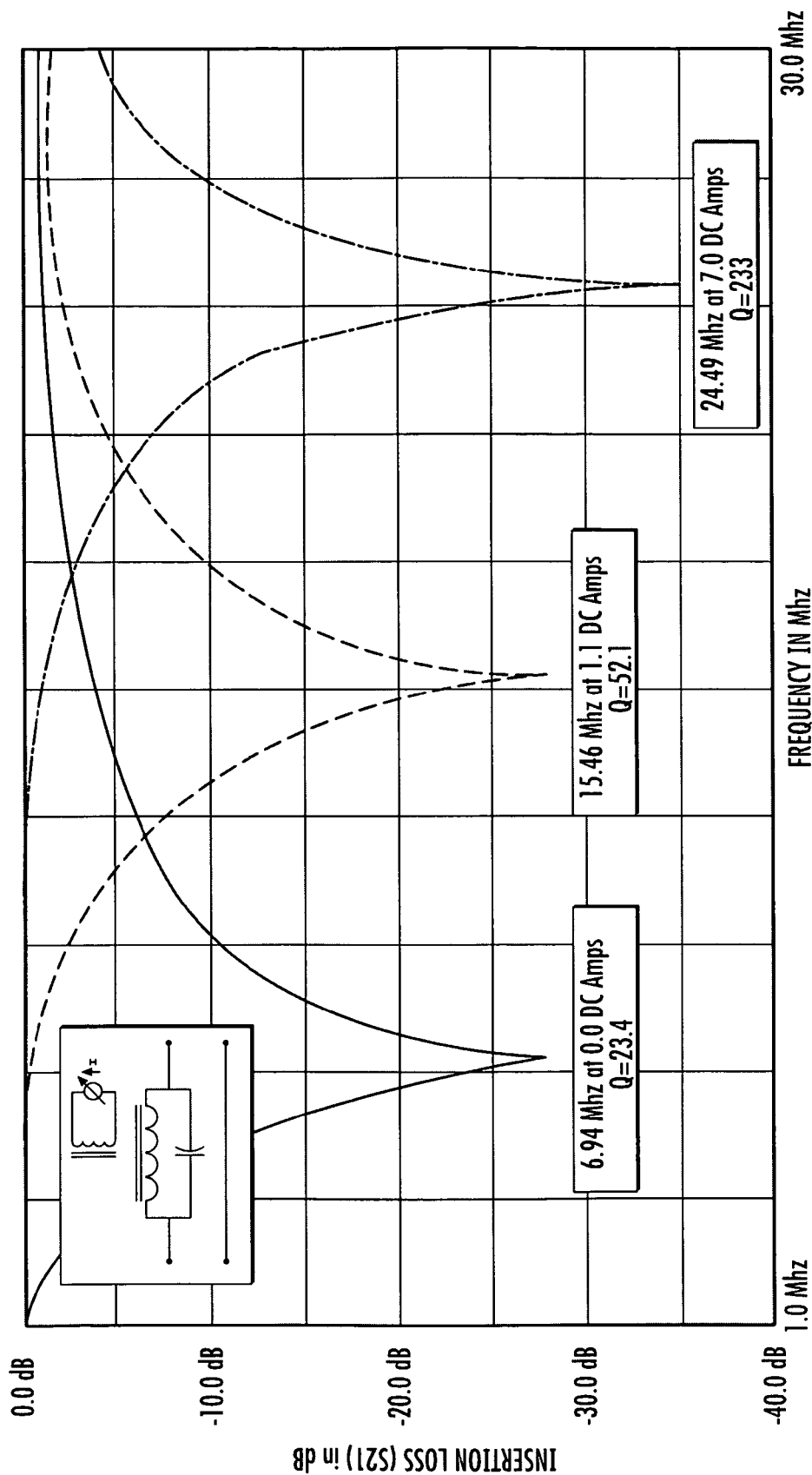
FIG. 3 is a graph illustrating the measured frequency response ($S_{21}$) of an example of the tunable filter in accordance with the features of the present invention.

An example of the operation of the FIG. 2 band stop filter using the present invention variable inductor will now be considered. FIG. 3 is a plot of the filters measured insertion loss (frequency response) with different DC tuning bias, and overall performance parameters for this example are provided in the following table:

| Measured Performance Of A Prototype Tunable Filter | |
|---|---|
| Filter Type | Tunable Band Reject (Bandstop) |
| Filter Topology | Passive LC Resonant Circuit (Single Pole) |
| Resonating Capacitance | 110 pf, fixed |
| Minimum Inductance | 0.38 uH |
| Maximum Inductance | 4.79 uH |
| Inductance Variation | 12.4 to 1 |
| Filter Tuning Range | 3.5 to 1 |
| Insertion Loss (Rejection) | 27 to 36 dB |

-continued

Measured Performance Of A Prototype Tunable Filter

| | |
|---|---|
| 3 dB Bandwidth | 8.3 to 0.85% |
| Q | 23 to 233 |
| Inductor Core | Nickel Zinc Ferrite Toroid |
| Inductor Core, Part # | Amidon-Micrometals FT-82-67 |
| Inductor Winding | #24 AWG, Enamelled |
| Inductor Turns, N | 5 |
| Port Impedances | 50 Ohms Nominal |
| Electromagnet Core | Laminated Silicon Steel |
| DC Control Current/Tuning Bias | 0 to 7 Amps |
| DC Magnetic Field | 0 to 1260 Ampere Turns |

In the embodiments, Q or filter sharpness was observed to rise for the higher values of DC bias (i.e. smaller values of inductance), due to increasing Q value of the inductor. This is beneficial in most instances as sharper filters may be desirable for the higher portions of operating bands as channel bandwidths often are constant, rather than a fractional proportion of operating frequency. For instance, in analog television broadcasting, the channels are each 6 MHz in bandwidth, even though 6 MHz is much larger fractional bandwidth at 54 MHz than is 6 MHz at 896 MHz. In general, DC magnetic bias on ferrite cores provides for higher Q lower loss inductors that may be used at higher frequencies.

Permeability tuned RF filters, such as the present invention provides the ability to rapidly adjust the notch frequency, and a similar approach can be used with band pass filtering if desired to adjust the passband frequency.

Communications channel linearity (freedom from intermodulation products, harmonic distortion or spurious signals) is a design consideration inherent in circuits using ferrite core inductors. In the present invention, tuning "pull" may trade with linearity in a complex relationship: in some operating regions linearity may actually be improved, especially those remote from saturation, and in others linearity may be reduced, especially near saturation. An example of intermodulation trades in biased inductors is provided by the paper "Dual-Frequency Distortion Predictions For The Cutler VLF Array", Eric Berg, et al., IEEE Transactions On Aerospace and Electronic Systems, Vol. 39, No. 3 Jul. 2003.

As background, linearity relates to magnetic domain grouping or Barkhausen Effect, caused by rapid changes in size of magnetic domains (similarly magnetically oriented atoms in ferromagnetic materials). In general, the RE magnetic material trades include powdered, pentacarbonyl iron type inductor cores which offer greater linearity but less tuning range, and ferrites which offer more tuning range but less linearity. This is because powdered iron cores generally saturate less easily then do ferrite cores.

Applying a DC magnetic field to the inductor core 32 alters the permeability of the ferrite core and thereby changes the inductance of the coil 34. The conductive electromagnet material isolates the RF circuit from the DC control circuitry and vice versa (e.g. which may be the principle advantage of using a silicon-steel core). The laminated electromagnet material reduces eddys for higher speed control. The DC control (tuning response) of the tunable inductive device 10 was observed to about linear for small amounts of DC bias, and smooth and monotonic for larger tuning bias.

Permanent magnets may be included to coarsely adjust the inductance of the present invention, to increase Q and efficiency of the inductor core 32, or to raise the usable frequency range of inductor core 32.

Although the electromagnet core 14 is preferentially a "soft" magnetic material such as silicon steel that does not retain permanent magnetism, the electromagnet core 14 may alternatively have properties of remnance (retention of permanent magnetism). In this case, the method of DC control may include the application of DC pulses to tuning coil 16 to alternately magnetize or demagnetize an electromagnet core 14 of remnant or hard magnetic material. The DC magnetizing pulses my be in trains and the polarity of the DC pulses may be reversed to magnetize or demagnetize as needed, to reduce power consumption necessary to maintain a constant magnetic tuning field from a soft core material, for example.

A nonlimiting application for the present invention is dynamic antenna tuning. In dynamic antenna tuning, antenna resonant frequency is shifted in unison the with signal modulation, e.g. while transmitting a digital minimum shift keyed (MSK) type signal. As antenna instantaneous gain bandwidth is fundamentally related to antenna size, dynamic antenna tuning allows reduced antenna size, by allowing a smaller more instantaneously narrowband antenna to follow transmitted signal modulation and spectrum.

The tunable filter may address the significant co-site interference problems encountered on military ships, where multiple transmitters and receivers must operate in close proximity to one another, since separation between antennas is necessarily limited. At HF on ships it can be difficult to obtain even 20 to 30 dB of isolation between HF antennas by spacing alone. Shipboard receiver RF preselector and postselector filters must reject strong nearby signals without becoming disabled themselves, and the present invention can be preferable to varactor diode tuning in such applications.

A method aspect is directed to making an electrically tunable inductive device 10. The method includes providing an electromagnet 12 including an electromagnet core 14 and a tuning coil 16 cooperating therewith to define opposing magnetic poles 18, 20 for generating a variable magnetic field. The method includes providing an inductor 30 being tunable based upon the variable magnetic field and comprising an inductor core 32, e.g. having a toroidal shape, and fixed at a position adjacent the opposing magnetic poles 18, 20 of the electromagnet core 14. A signal coil 34 is wrapped around at least a portion of the inductor core 32.

Therefore, a tunable reactive component suitable for high RF power levels is provided by a ferrite toroidal inductor magnetically biased by a DC electromagnet. The tunable reactive component is inductive and operable at HF, VHF and other frequencies.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electrically tunable inductive device comprising:
    an electromagnet comprising a silicon-steel electromagnet core and a bias coil cooperating therewith to define opposing magnetic poles for generating a variable magnetic field;
    said electromagnet core comprising a pair of opposing legs and a bight portion therebetween defining a horseshoe shape; and
    an inductor being tunable based upon the variable magnetic field within the inductor and comprising an inductor core having a toroidal shape and fixed at a position adjacent the opposing magnetic poles of said electromagnet, and an inductor coil around at least a portion of the inductor core.

2. The electrically tunable inductive device of claim 1, wherein said inductor core is positioned between ends of the opposing legs of said electromagnet core.

3. The electrically tunable inductive device of claim 2, wherein said bias coil surrounds said bight portion of said core.

4. The electrically tunable inductive device of claim 1, wherein the inductor core comprises a ferrite core.

5. The electrically tunable inductive device of claim 1, wherein the inductor core comprises a nickel zinc ferrite core.

6. The electrically tunable inductive device of claim 1, wherein the inductor core comprises a powdered iron core.

7. The electrically tunable inductive device of claim 1, further comprising a radio frequency (RF) feed connected to the inductor coil and a capacitor connected therebetween.

8. An electrically tunable inductive device comprising:

an electromagnet comprising an electromagnet core and a bias coil cooperating therewith to define opposing magnetic poles for generating a variable magnetic field, said electromagnet core comprising a pair of opposing legs and a bight portion therebetween defining a horseshoe shape, said bias coil surrounding said bight portion of said electromagnet core; and an inductor being tunable based upon the variable magnetic field and comprising a ferrite inductor core fixed at a position between ends of the opposing legs of said electromagnet core; and an inductor coil around at least a portion of the inductor core.

9. The electrically tunable inductive device of claim 8, wherein said inductor core has a toroidal shape.

10. The electrically tunable inductive device of claim 8, wherein the electromagnet core comprises a silicon-steel core.

11. The electrically tunable inductive device of claim 8, further comprising a radio frequency (RF) feed connected to the inductor coil and a capacitor connected therebetween.

12. A band-stop tunable filter comprising:

an electrically tunable inductive device including an electromagnet comprising an electromagnet core and a bias coil cooperating therewith to define opposing magnetic poles, and a tunable inductor comprising an inductor core having a toroidal shape and fixed at a position adjacent the opposing magnetic poles of said electromagnet, and an inductor coil around at least a portion of said inductor core;

a radio frequency (RF) feed connected to said inductor coil; and a control signal feed connected to said bias coil.

13. The band-stop tunable filter of claim 12, wherein said electromagnet core comprises a pair of opposing legs and a bight portion therebetween defining a horseshoe shape.

14. The band-stop tunable filter of claim 13, wherein said inductor core is positioned between ends of the opposing legs of said electromagnet core.

15. The band-stop tunable filter of claim 14, wherein said bias coil surrounds said bight portion of said electromagnet core.

16. The band-stop tunable filter of claim 12, wherein said electromagnet core comprises a silicon-steel core.

17. A method of making an electrically tunable inductive device comprising:

providing an electromagnet comprising a silicon-steel electromagnet core and a bias coil cooperating therewith to define opposing magnetic poles for generating a variable magnetic field by at least forming the electromagnet core with a pair of opposing legs and a bight portion therebetween defining a horseshoe shape; and providing an inductor being tunable based upon the variable magnetic field and comprising an inductor core having a toroidal shape and fixed at a position adjacent the opposing magnetic poles of the electromagnet, and an inductor coil around at least a portion of the inductor core.

18. The method of claim 17 wherein providing the inductor includes positioning the inductor core between ends of the opposing legs of the electromagnet core.

19. The method of claim 18, wherein providing the electromagnet includes wrapping the bight portion of the electromagnet core with the bias coil.

20. The method of claim 17, further comprising connecting a radio frequency (RF) feed to the inductor coil and a capacitor therebetween.

21. A method of making an electrically tunable inductive device comprising:

providing an electromagnet comprising an electromagnet core and a bias coil cooperating therewith to define opposing magnetic poles for generating a variable magnetic field;

providing an inductor being tunable based upon the variable magnetic field and comprising an inductor core having a toroidal shape and fixed at a position adjacent the opposing magnetic poles of the electromagnet, and an inductor coil around at least a portion of the inductor core; and connecting a radio frequency (RF) feed to the inductor coil and a capacitor therebetween.

* * * * *